US006784389B2

(12) United States Patent
Belanger, Jr. et al.

(10) Patent No.: US 6,784,389 B2
(45) Date of Patent: Aug. 31, 2004

(54) FLEXIBLE CIRCUIT PIEZOELECTRIC RELAY

(75) Inventors: Thomas Dudley Belanger, Jr., Saline, MI (US); David John Rutkowski, Grosse Ile, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 10/063,027

(22) Filed: Mar. 13, 2002

(65) Prior Publication Data

US 2003/0173196 A1 Sep. 18, 2003

(51) Int. Cl.⁷ .............................. H01L 41/083
(52) U.S. Cl. ....................................... 200/181
(58) Field of Search ........................... 200/181

(56) References Cited

U.S. PATENT DOCUMENTS

| | | | |
|---|---|---|---|
| 4,093,883 A | 6/1978 | Yamamoto | 310/317 |
| 4,403,166 A | 9/1983 | Tanaka et al. | 310/332 |
| 4,445,732 A | 5/1984 | Wafer | 439/38 |
| 4,564,832 A | 1/1986 | Inoue | 340/365 R |
| 5,051,643 A * | 9/1991 | Dworsky et al. | 200/181 |
| 5,121,091 A | 6/1992 | Fujiyama | 335/1 |
| 5,156,553 A | 10/1992 | Katsumata et al. | 439/62 |
| 5,161,985 A | 11/1992 | Ramsey | 439/284 |
| 5,501,009 A | 3/1996 | McClure | 29/882 |
| 5,727,956 A | 3/1998 | Mitra et al. | 439/74 |
| 5,921,787 A | 7/1999 | Pope et al. | 439/660 |
| 6,191,671 B1 * | 2/2001 | Schlaak et al. | 335/78 |
| 6,483,395 B2 * | 11/2002 | Kasai et al. | 200/181 |
| 6,504,118 B2 * | 1/2003 | Hyman et al. | 200/181 |
| 2002/0089254 A1 * | 7/2002 | Dausch et al. | 310/311 |

FOREIGN PATENT DOCUMENTS

WO      WO 94/19819     * 9/1994

OTHER PUBLICATIONS

Face International Corporation, http://www.face-int.com/thunder/tech/content/tcont2a.htm Pages from website on the subject of Thin Layer Composite Unimorph Ferroelectric Driver and Sensor (THUNDER) Technology. (copyright 1998).

* cited by examiner

Primary Examiner—Renee Luebke

(57) ABSTRACT

An arrangement of a flex circuit relay 7 is provided. The flex circuit relay 7 has a first substrate 10. A first connective member 24 is connected on the first substrate 10. A second flexible substrate 20 is provided having a contact portion 30 spaced away from the first substrate 10 in a first position and being spaced adjacent to the first substrate 10 in a second position. A second conductive member 26 is provided on the second substrate 20 for making contact with the first conductive member 24. A piezoelectric actuator 28 is connected with the second substrate 20 to cause the second substrate contact portion 30 to move between the first and second positions.

3 Claims, 2 Drawing Sheets

FLEXIBLE CIRCUIT PIEZOELECTRIC RELAY

BACKGROUND OF INVENTION

The present invention relates to flexible circuits and more particularly to flexible circuits utilized in the automotive industry which can additionally incorporate relays for circuits.

In the most recent quarter century the utilization of electronics in automotive vehicles has increased significantly. For example virtually all automotive vehicles have an engine control module to optimize the performance of the engine with regard to fuel efficiency and environmental emissions. Inflatable restraints have been added to enhance occupant safety in a crash situation. Advanced braking systems, such as anti-skid braking and traction control further enhance safe operation of the vehicle. Other electrical systems have been added or enhanced to increase the comfort of the vehicle. The above mentioned additions and enhancements have resulted in a more complex wiring system which supplies power and signal transfer to and from various electrical components and controllers. Currently, much of the power and signaling requirements of a vehicle are supplied by hard conductive wiring, which is housed in a wiring harness. Fabrication of a wiring harness is a very labor intensive operation. Installation and/or repair of a wiring harness can also be very time consuming and expensive. Another disadvantage associated with the hard copper conductive wiring is the cost associated with the copper. For certain applications the copper wire needed to provide for signal transfer at a low electrical load can be provided by a copper wire of a very small cross-sectional area. However, a minimum diameter of copper wiring is not determined by its electrical requirements. The minimum diameter of the wiring is determined by its frailty during the assembly process of the wiring harness and of the wiring of the vehicle.

To reduce the cost of automotive wiring harnesses a new type of electrical conduit has been provided. This new conduit is typically referred to as a flexible circuit. In a flexible circuit, a polymeric (or insulated metallic ribbon) substrate which is flexible, provides support for the various electrical conductor lines. The electrical conductors are then supplied by a foil that is affixed to the flexible substrate. Another flexible layer of polymeric material can cover the conductors on the flexible substrate.

The utilization of flexible circuits as a replacement for the prior wiring harnesses has been limited due to the particular problems faced by flexible circuits at the various component interfaces. For instance, the interface of the flexible circuit with a fuse box has been a particular limiting factor. To overcome those limitations, an inventive contact method has been provided in U.S. Pat. No. 6,302,704 filed Apr. 22, 1999. Other examples of connector interfaces for flexible circuits can be found in a review of U.S. Pat. Nos. 5,885,091 and 5,969,418.

Another problem with the utilization of flexible circuits is in the use of relays. Relays are typically switches that have two contacts which are spring biased toward or away from each other, and are activated (closed or opened) by an electromagnetic force by a selectively excitable electromagnetic coil. Relays are typically provided for high current applications that require momentary application. Relays are commonly self-contained entities that contain a coil and contacts. Relays are typically prepackaged to a predetermined physical footprint. The design of relays is mostly controlled by their manufacturers and users of such relays adapt their circuits to predesigned physical specifications. Two major elements in the design of relays are the generation of high current contact heat between the contacts, and the amount of current which is allowed in the exciting coil which is typically of a much lower current. Because of the current capabilities of the contacts of the relay, most relays have a solid post with a relatively high mass. The relay coil is typically specified to be excited by a low current and therefore has very low mass copper wires. When connecting the relay to a conventional circuit board the high relative mass of the relay terminals provides a relatively large heat sink so that lots of heat is required to assemble the relay to the remainder of the circuit. This heat required for assembly is typically within the limits of a rigid circuit board. However, with a flexible circuit no such rigid circuit board is provided and items such as relays which require a high heat input are difficult to assemble to the flexible circuit. Providing the heat required for many relays causes the flexible circuit to become warped and deformed.

Prior to the present invention, to accommodate the heat of assembly the flexible circuit often has to be redesigned to be a non-planar structure with a much larger mass than desirable. Such a modification of the flexible circuit diminishes its many advantages. Flexibility of the flexible circuit is especially important in applications of engine control modules which often have physically large circuits which are folded over for placement within a mounting box to conserve space within the engine compartment of the vehicle.

It is desirable to provide a flexible circuit which allows for the relatively higher current contacts in connecting one circuit to another that is typically required in the utilization of a relay without having a flexible circuit with an increased mass which will diminish its characteristics of flexibility. It is furthermore even more desirable to have an arrangement of a flex circuit relay which can eliminate the requirements of a coil member.

SUMMARY OF INVENTION

In a preferred embodiment an arrangement of a flex circuit relay is provided. A first substrate is provided which may be a flex circuit or a conventional rigid circuit board. A pair of gapped conductive members which may be tracings or surface mounted devices are also provided connected on the first substrate. A second flexible substrate is provided. The second flexible substrate is supported away from the first substrate. The second substrate has a contact portion. Connected to the contact portion is a conductive member which may be a connective member provided by an etched conductor or by a surface mounted device.

In a first position with respect to the first substrate, the contact portion of the second substrate is spaced away from the first substrate. In a second position with respect to the first substrate, the contact portion of the second substrate is spaced adjacent to the first substrate. A piezoelectric actuator is connected to the second substrate which enables the second substrate contact portion to move between the first and second positions with respect to the first substrate. When moved to the second position adjacent to the first substrate, the second conductive member bridges the gap between the pair of conductive members of the first substrate to complete the circuit. The flex circuit relay of the present invention can be configured to be normally on or normally off.

An advantage of the present invention is that the piezoelectric actuator eliminates the use for a coil and provides a relay typically having a much thinner profile than a relay device which utilizes a coil.

Other features and advantages of various embodiments of the present invention will become more apparent to those skilled in the art from the reading of the following detailed description and upon reference to the drawings.

DETAILED DESCRIPTION

Figure 1:
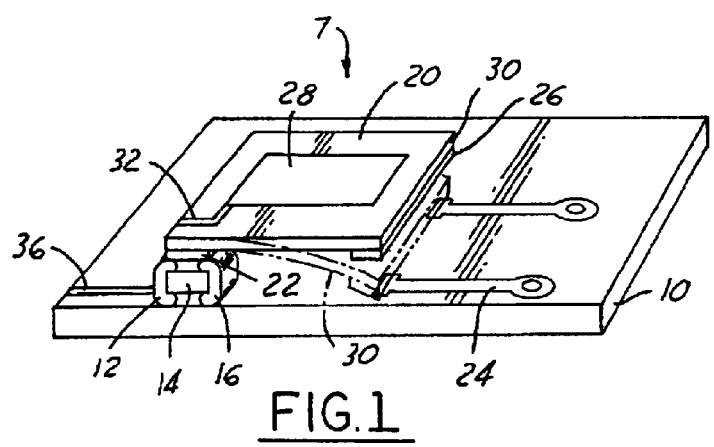
FIG. 1 is a perspective view of a preferred embodiment of a flexible relay according to the present invention shown in a cantilever type arrangement.

FIG. 1 illustrates a preferred embodiment arrangement of a flex circuit relay 7 according to the present invention. The relay includes a first substrate 10 that will typically be a non-flexible rigid printed wiring board (PWB) material such as FR4. Other materials such as polyvinylidine fluoride (PVDF) and Teflon can be utilized. Non-flexible substrate materials such as ceramic, coated steel or other suitable electronic substrate materials can also be utilized. Furthermore, substrate can be a metal ribbon that is insulated by post-lamination process, or by use of an adhesive which bonds a conductor to the substrate. If a metal ribbon substrate is provided it can be utilized as part of an electrical circuit as a ground plane.

Connected on the first substrate is a conductive elevator 12. The elevator 12 may be a portion of FR-4 or CEM circuit board material. The elevator 12 as shown is a surface mounted device which comprises a flat chip resistor. Other suitable surface mounted devices are capacitors, inductors, fuses, shunts and other various other electrical elements. The elevator surface mounted device 12 has an aluminous substrate 14. The elevator surface mounted device has two outer post terminals or end caps 16.

Supported by two elevators 12 (only one shown in FIG. 1) is a second substrate 20. The second substrate 20 is fabricated from a polymeric material and typically is approximately 0.75 millimeters thick. Preferred values have been found between a range of 0.25 and 1.5 millimeters. However, the present invention can utilize flexible substrates with thicknesses lower or greater than the aforementioned range.

A preferred material for the second substrate 20 is polyamide. Polyamide is often preferable for soldering electrical devices to the second substrate 20. When a conductive adhesive is utilized to connect electrical devices to the second substrate 20 in lieu of soldering, polyester has been found to be suitable.

The second substrate 20 can also include other materials such as PVDF and Teflon. Furthermore, the second substrate 20 can be a metal foil ribbon which is insulated by a post-lamination process, or by use of an adhesive which is used to bond a conductive member to the second substrate 20. However, when metal is utilized it must be thin enough to ensure the proper flexible properties.

The second substrate 20 has an under bent portion 22 to aid its cantilever support arrangement upon the elevator 12.

In other embodiments (not shown), the second substrate may be wrapped around the elevator, and an adhesive layer may be employed to hold the elevator to the second substrate. Also the flexible second substrate may be mounted to a top surface of the elevator and interfaced to a plated through hole which is in turn interfaced to the lower substrate.

Connected to the first substrate 10 is a pair of conductive members 24 which are gapped away from each other. The conductive members 24 may be a membrane as shown, or surface mounted devices as described in co-pending U.S. patent application Ser. No. 09/777,982. As shown, the conductive members 24 are a foil or powder copper which has been etched out in a circuit desired pattern.

In other embodiments (not shown), the conductive member 24 materials can include aluminum or unsolderable materials such as aluminum or aluminum alloy which is cladded over copper. The copper will allow an electrical component to be attached to the conductive member by soldering although aluminum is being relied upon to perform the conductive function.

Connected to the second substrate 20 is a second conductive member 26. The conductive member 26 may be a membrane as shown or may be a surface mounted device.

Connected to a side of the second substrate 20 generally opposite the first substrate 10 is a piezoelectric actuator 28. In other embodiments (not shown) the piezoelectric actuator 28 may be positioned on a side of the second substrate adjacent to the first substrate (underneath the second substrate) or may be sandwiched inside the second substrate itself. As shown, the piezoelectric actuator 28 is a film piezoelectric or a ceramic piezoelectric. If utilizing a ceramic piezoelectric actuator, the actuator may be multi-layered having a middle layer of lead zircornate titanate (PZT). Above and below the PZT layer is a high temperature polymide adhesive layer called LaRC-SI. The bottom LaRC-SI layer is adhesively joined to a thin layer of stainless steel. The top LaRC-SI layer is joined to a layer of aluminum. Such devices are typically referred to as a thin layer unimorph ferroelectric driver and sensor. Such devices are made under the tradename Thunder by Face International Corporation, Norfolk, Va. However, other suitable piezoelectric actuators may be utilized.

The second substrate has a contact portion 30. The contact portion 30 is covered by the second conductive member 26. In a first position, the contact portion 30 is spaced away from the first substrate 10. In a second position, the contact portion 30 is spaced adjacent to the first substrate 10. The piezoelectric actuator 28 moves the second substrate 20 to move the contact portion 30 between the first and second positions.

In the second position (shown in phantom) the second conductive member 26 electrically connects the conductive members 24 together to complete a circuit. Typically, the actuator 28 will be excited by a voltage source which is delivered by an etched conductive path 32 which also travels along the bent portion 22 of the second substrate 20 to make contact with at least one of the end caps 16 of the elevator 12 and thereafter to make contact with etched conductive path 36 provided on the first substrate.

It is to be noted that the second substrate 20 can have two separate gapped conductive members which when brought adjacent to the first substrate 10 are connected by a connective member placed on the substrate 10. The flex circuit relay arrangement of FIG. 1 can be configured to be in the first position spacing the conductive member 26 from the conductive members 24 when voltage is applied or when voltage is removed from the actuator 28 to provide a normally on or normally off relay circuit arrangement.

Figure 2:
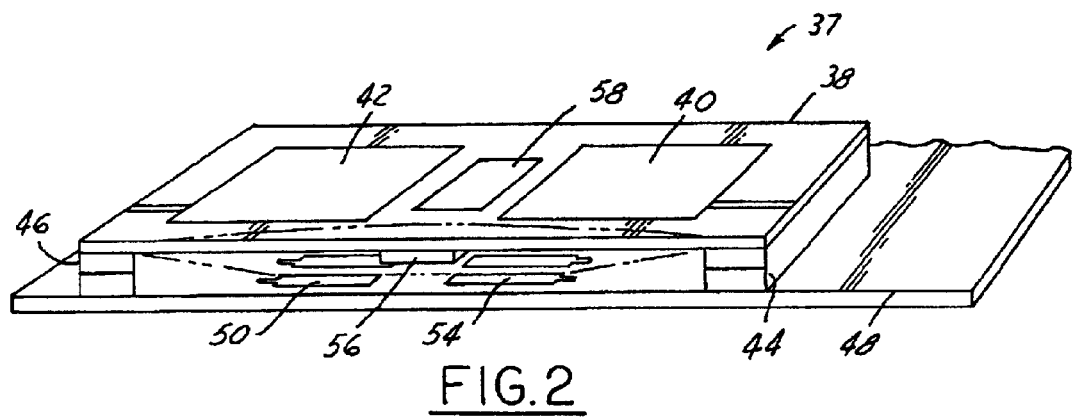
FIG. 2 is a perspective view of an alternate preferred embodiment of a flexible relay according to the present invention shown in a supported beam-type multiple piezoelectric actuator arrangement.

An alternate preferred embodiment relay arrangement 37 is provided in FIG. 2. A second substrate 38 is provided. The second substrate 38 has connected thereto piezoelectric actuators 40, 42. The flexible second substrate 38 is supported by elevators 44, 46 along its opposite extreme ends. The elevators 44, 46 support the second substrate 38 in a beam-like fashion over a first substrate 48. The first substrate 48 has etched thereon conductive members 50, 54. Activation of the actuators 40, 42 causes the second substrate 38 to bow to a lower position (shown in phantom) to cause a conductive member 56 connected on the underside of the second substrate 38 to electrically connect the conductive members 50, 54 which are connected on the first substrate 48. Again, the second substrate may be configured that it normally is bowed to the lower phantom position and when the actuators 40, 42 are excited, the second substrate assumes the dark line position shown in FIG. 2 providing a normally open switch. To provide a normally closed switch, the second substrate will be in its solid line position and will bow down.

The configuration of FIG. 2 offers further advantages in that it allows for more complex logic. By varying the strength of piezoelectric actuators 40, 42 an arrangement can be made wherein both piezoelectric actuators must be excited to allow conductive path member 56 to electrically connect conductive members 50, 54 or only one of the piezoelectric actuators 40, 42 needs to be excited to cause the second substrate 38 to move between its first and second positions. Another logic option is that actuator 42 may be powerful enough to make the substrate 38 move to the second position alone. However, actuator 40 would need the additional action of actuator 42 to cause the substrate 38 to assume the second position.

The configuration of FIG. 2 can also be utilized when it is desirable to allow for a patch 58 to be provided to allow for a push button control to activate the connection between conductive members 50, 54 in absence of an electrical signal which activates the actuator 40 or 42.

The piezoelectric actuators 40, 42 can also be configured to make the second substrate 38 bow upwards as shown in the upper phantom line when actuated. In an alternative the piezoelectric actuators 40, 42 may naturally cause the second substrate to bow upwards and straighten out the second substrate 38 when actuated. If an appropriate circuit is added the relay arrangement 37 can be such that after the patch 58 has been pushed downward by an operator causing a connection between conductive members 50, 56 and 54. An appropriate circuit may be latched to cause the piezoelectric actuators 40, 42 to deform to raise the patch 58 vertically upward. Accordingly the operator of the vehicle can feel the raised patch 58 and have tactile feedback confirmation that actuation of the circuit has occurred.

The embodiment of FIG. 2 shows a second substrate 38 as a single rectangular piece. However, the second substrate may extend beyond its rectangular borders as shown and may be a sheet that is spaced away from a lower first substrate 48 by strategically placed elevators 44, 46.

Figure 3:
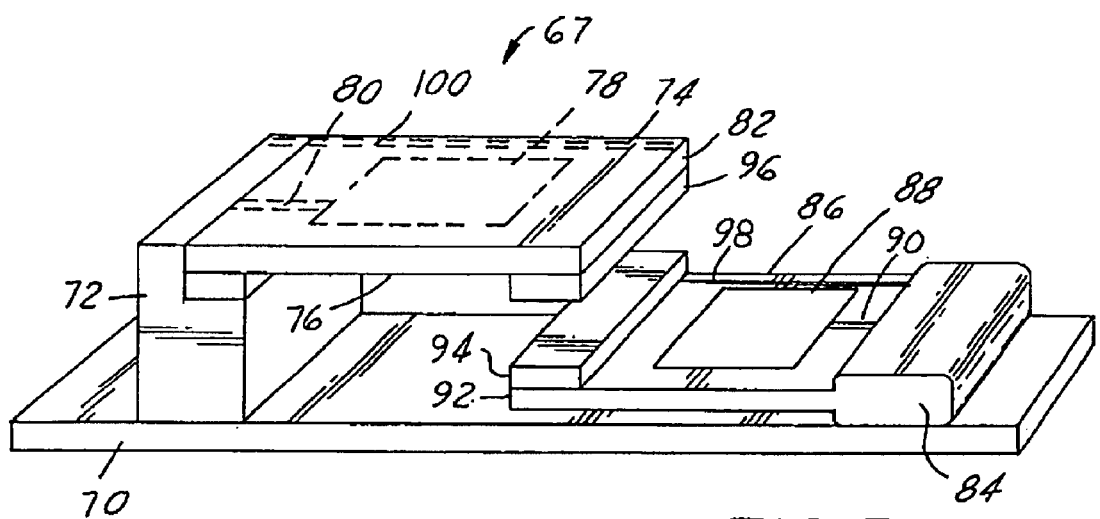
FIG. 3 is a perspective view of another alternate preferred embodiment of a flexible relay according to the present invention utilizing two separate cantilever flexible substrates.

FIG. 3 illustrates another alternate preferred embodiment arrangement of a flex circuit relay 67. Relay 67 has a first substrate 70. Connected on the first substrate 70 is a conductive elevator 72. The conductive elevator 72 cantileverly supports a second substrate 74. The second substrate has an underside 76 which is adjacent to the first substrate 70. The underside 76 of the second substrate 74 has connected thereto a piezoelectric actuator 78. The piezoelectric actuator is electrically connected by a conductive member 80. The second substrate 74 has a contact portion 82 along its front end. Additionally connected on the first substrate 70 is a second smaller elevator 84. Elevator 84 cantileverly supports a third flexible substrate 86. Flexible substrate 86 has connected thereto a piezoelectric actuator 88. The piezoelectric actuator 88 may be excited via a conductive member 90. Substrate 86 has a contact portion 92. Contact portion 92 has connected thereon a conductive member 94. The substrate 74 also has a conductive member 96 connected thereto.

The flex circuit relay arrangement 67 offers several advantages. The first advantage is that since both flex substrates can be actuated to move toward one another the relay can be made to be more sensitive. A conductive member 98 can connect with conductive member 94 and a conductive member 100 may be connected with conductive member 96 to complete a circuit by contact of the conductive members 94, 96. The flex circuit relay arrangement 67 has the logic options of the flex circuit arrangement 37 and additionally can be made such that the connection between connective members 94, 96 will only occur if actuator 78 is excited and actuator 88 is not excited. Alternatively, it can be arranged that actuator 78 alone will cause a connection; however actuator 88 alone will not cause such a connection between the connective members 94, 96.

In still other embodiments actuators 78, 88 must both be excited for a connection to be made or they can be normally engaged and require the excitation of one of the other or both of the piezoelectric actuators 78, 88 to be excited for the conductive members 94, 96 to disengage. Additionally substrates 74 and 86 may be portions of a continuous sheet which are supported overlapping each other in a cantilever fashion which would allow elimination of the elevators 72, 84.

Figure 4:
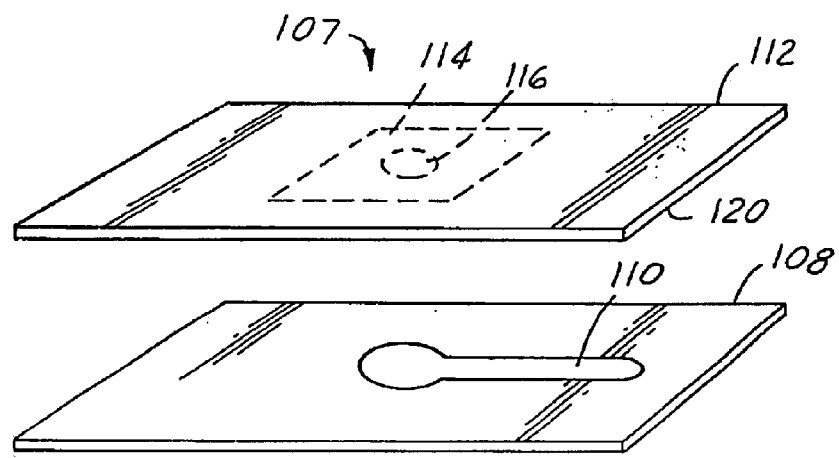
FIG. 4 is another alternate preferred embodiment flexible relay of the present invention utilizing two flexible substrates.

FIG. 4 provides still another alternate preferred embodiment arrangement 107 of a flex circuit relay according to the present invention. A lower substrate 108 is provided which may be rigid or flexible. Substrate 108 has etched thereon a conductive member 110. Spaced above the substrate 108 is a flexible substrate 112. Flexible substrate 112 has connected thereto a piezoelectric actuator 114. The actuator 114 is configured to have a conductive member 116 etched thereon which is on the underside 120 of the substrate 112. Activation of the actuator 114 causes a bowing downward of the substrate 112 such that the conductive member 116 electrically connects with the conductive member 110.

Figure 5:
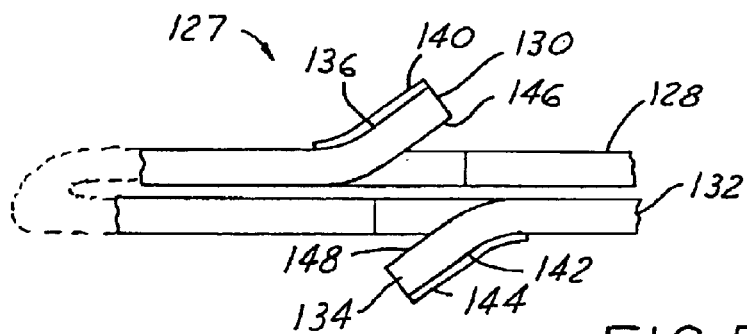
FIG. 5 is another alternate preferred embodiment flexible relay of the present invention utilizing two flexible substrates having integral tabs.

Referring to FIG. 5, a relay arrangement 127 is provided which is similar in operation and function to the relay arrangement 67. Relay arrangement 127 has an upper first substrate 128 with an integral cut-out tab portion 130. A lower second substrate 132 is provided. The lower second substrate 132 is spaced away from the upper first substrate 128 by a supporting structure (not shown). If desired the upper first substrate 128 and lower second substrate 132 can be provided by a folded one piece continuous flexible circuit membrane or ribbon member (shown in phantom in FIG. 5). The lower second substrate 132 has an integral cut-out tab portion 134.

The tab 130 on a side 136 has a piezoelectric actuator 140. The tab 134 on a side 142 has a piezoelectric actuator 144. If desired piezoelectric actuators 140, 144 can be placed upon opposite sides of their respective tabs or within their respective substrates 128, 142. As shown, the tabs 130, 134 are in their first non-actuated, spaced away position and activation of the piezoelectric circuits causes the tabs 130, 134 to be actuated and placed toward one another causing contact between first and second conductive members which are etched or printed on sides 146, 148 of the tabs. The relay arrangement 127 can be configured to be normally opened upon non-activation or to be normally closed upon activation. The other logic options as previously discussed in regards to relay arrangement 67 are also available.

While preferred embodiments of the present invention have been disclosed, it is to be understood that they have been disclosed by way of example only and that various modifications can be made without departing from the spirit and scope of the invention as it is encompassed by the following claims.

What is claimed is:

1. An arrangement of a flex circuit relay comprising a first flexible substrate cantileverly supported;
   a first conductive member connected on said first substrate;
   a second flexible substrate cantileverly supported;
   a second conductive member connected on said second substrate;
   a first film piezoelectric actuator for moving said first flexible substrate between a first position spacing said first conductive member away from said second conductive member and a second position placing said first conductive member adjacent to said second conductive member; and
   a second film piezoelectric actuator connected on said second substrate to cause said second substrate to move said second conductive member from a first position spaced away from said first conductive member and a second position wherein said second conductive member is spaced adjacent to said first conductive member.

2. An arrangement of a flex circuit relay comprising:
   a first flexible substrate having a first integral tab portion;
   a first conductive member connected on said first substrate tab portion;
   a second flexible substrate having a second integral tab portion;
   a second conductive member connected on said second substrate second tab portion;
   a first piezoelectric actuator for moving said first substrate tab portion between a first position spacing said first conductive member away from said second conductive member and a second position placing said first conductive member adjacent to said second conductive member; and
   a second piezoelectric actuator for moving said second substrate tab portion between a first position spaced away from said first conductive member and a second position placing said second conductive member adjacent to said first conductive member.

3. An arrangement of a flex circuit relay as described in claim 1, wherein said first and second substrates are formed from a continuous member.

* * * * *